United States Patent
Guo et al.

(10) Patent No.: US 12,211,953 B2
(45) Date of Patent: Jan. 28, 2025

(54) LIGHT-EMITTING DIODE INCLUDING CONDUCTIVE MIRROR STRUCTURE

(71) Applicant: XIAMEN SAN'AN OPTOELECTRONICS TECHNOLOGY CO., LTD., Fujian (CN)

(72) Inventors: Guitian Guo, Fujian (CN); Liqin Zhu, Fujian (CN); Linrong Cai, Fujian (CN); Lixun Yang, Fujian (CN)

(73) Assignee: QUANZHOU SAN'AN SEMICONDUCTOR TECHNOLOGY CO., LTD., Fujian (CN)

( * ) Notice: Subject to any disclaimer, the term of this patent is extended or adjusted under 35 U.S.C. 154(b) by 207 days.

(21) Appl. No.: 17/118,231

(22) Filed: Dec. 10, 2020

(65) Prior Publication Data
US 2021/0135053 A1    May 6, 2021

Related U.S. Application Data

(63) Continuation-in-part of application No. PCT/CN2018/115246, filed on Nov. 13, 2018.

(51) Int. Cl.
*H01L 33/60* (2010.01)
*H01L 33/22* (2010.01)
*H01L 33/56* (2010.01)
*H01L 33/46* (2010.01)

(52) U.S. Cl.
CPC .............. *H01L 33/22* (2013.01); *H01L 33/56* (2013.01); *H01L 33/60* (2013.01); *H01L 33/46* (2013.01)

(58) Field of Classification Search
CPC ....... H01L 33/405; H01L 33/42; H01L 33/46; H01L 33/38; H01L 33/60; H01L 33/22; H01L 33/56
USPC .................................. 257/79, 94, 98, 33.072
See application file for complete search history.

(56) References Cited

U.S. PATENT DOCUMENTS

| | | | | |
|---|---|---|---|---|
| 2007/0131956 | A1* | 6/2007 | Lin | H01L 33/60 |
| | | | | 257/E33.068 |
| 2007/0194327 | A1* | 8/2007 | Ueda | H01L 33/405 |
| | | | | 257/E33.068 |
| 2010/0140637 | A1* | 6/2010 | Donofrio | H01L 33/42 |
| | | | | 257/E33.023 |

(Continued)

FOREIGN PATENT DOCUMENTS

CN    108258097    7/2018

OTHER PUBLICATIONS

Search Report appended to an Office Action, which was issued to Chinese counterpart application No. 201880035522.1 by the CNIPA on Feb. 17, 2023, with an English translation thereof. (4 pages).

*Primary Examiner* — David Chen
(74) *Attorney, Agent, or Firm* — DLA PIPER LLP (US); Blake W. Jackson

(57) ABSTRACT

A light-emitting diode includes an epitaxial layered structure and a conductive mirror structure which includes a first electrically conductive layer and a second electrically conductive layer disposed on the epitaxial layered structure in such order. The first and second electrically conductive layers respectively have a first reflectance R1 and a second reflectance R2 to light emitted from the epitaxial layered structure, and R1<R2.

13 Claims, 15 Drawing Sheets

(56) References Cited

U.S. PATENT DOCUMENTS

| | | | |
|---|---|---|---|
| 2012/0244653 A1* | 9/2012 | Totani | H01L 33/007 |
| | | | 257/E33.072 |
| 2013/0203194 A1* | 8/2013 | Totani | H01L 33/60 |
| | | | 438/29 |
| 2013/0285099 A1* | 10/2013 | Hodota | H01L 33/46 |
| | | | 257/98 |
| 2015/0280070 A1* | 10/2015 | Lee | H01L 33/505 |
| | | | 257/98 |
| 2016/0087173 A1* | 3/2016 | Mayer | H01L 33/08 |
| | | | 438/29 |
| 2017/0250314 A1* | 8/2017 | Ishiguro | H01L 33/405 |
| 2018/0190872 A1* | 7/2018 | Huang | H01L 33/405 |
| 2018/0240940 A1* | 8/2018 | Lee | H01L 33/46 |
| 2019/0164945 A1* | 5/2019 | Chae | H01L 33/0093 |

* cited by examiner

LIGHT-EMITTING DIODE INCLUDING CONDUCTIVE MIRROR STRUCTURE

CROSS-REFERENCE TO RELATED APPLICATION

This application is a bypass continuation-in-part (CIP) application of PCT International Application No. PCT/CN2018/115246, filed on Nov. 13, 2018. The entire content of the International patent application is incorporated herein by reference.

FIELD

This disclosure relates to a semiconductor device, and more particularly to a light-emitting diode (LED).

BACKGROUND

Light-emitting diodes (LEDs) are widely applied as solid-state light sources due to advantages such as a relatively low energy consumption and a relatively long service life compared to conventional light sources (e.g., incandescent lamps or fluorescent lamps). Therefore, LEDs have gradually replace conventional light sources in various applications such as traffic lights, backlight modules, pedestrian lights, medical equipments, etc. To increase a light extraction efficiency, a conventional LED generally includes a reflective layer (e.g., made of metallic layer such as Ag) formed below an epitaxial structure, and a light-transmissive layer (e.g., made of an insulating material) disposed between the reflective layer and the epitaxial structure, so as to effectively reflect light emitted downwardly from the epitaxial structure. In order to improve the poor adhesion between the insulating material of the light-transmissive layer and the metallic material of the reflective layer, an adhesive layer (e.g., made of indium tin oxide) might be formed between the reflective layer and the light-transmissive layer. However, indium tin oxide in the adhesive layer tends to absorb light emitted from the epitaxial structure, especially a light having a relatively short wavelength (e.g., within the ultraviolet range), which might greatly reduce the brightness of the LED.

SUMMARY

Therefore, an object of the disclosure is to provide a light-emitting diode (LED) that can alleviate or eliminate at least one of the drawbacks of the prior art.

According to the disclosure, the LED includes an epitaxial layered structure and a conductive mirror structure. The epitaxial layered structure includes a first semiconductor layer, an active layer disposed on the first semiconductor layer, and a second semiconductor layer disposed on the active layer opposite to the first semiconductor layer. The conductive mirror structure includes a first electrically conductive layer disposed on the second semiconductor layer opposite to the active layer, and a second electrically conductive layer disposed on the first electrically conductive layer opposite to the epitaxial layered structure. The first electrically conductive layer has a first reflectance $R_1$ to light emitted from the epitaxial layered structure. The second electrically conductive layer has a second reflectance $R_2$ to light emitted from the epitaxial layered structure. The first reflectance $R_1$ is smaller the second reflectance $R_2$, i.e., $R_1 < R_2$.

BRIEF DESCRIPTION OF THE DRAWINGS

Other features and advantages of the disclosure will become apparent in the following detailed description of the embodiments with reference to the accompanying drawings, in which:

FIGS. 20 to 25 are schematic views illustrating consecutive steps of a method for manufacturing a fourth embodiment of the LED according to the disclosure, in which FIG. 22 shows a comparison between scribe lines of the third and fourth embodiments;

DETAILED DESCRIPTION

Figure 1:
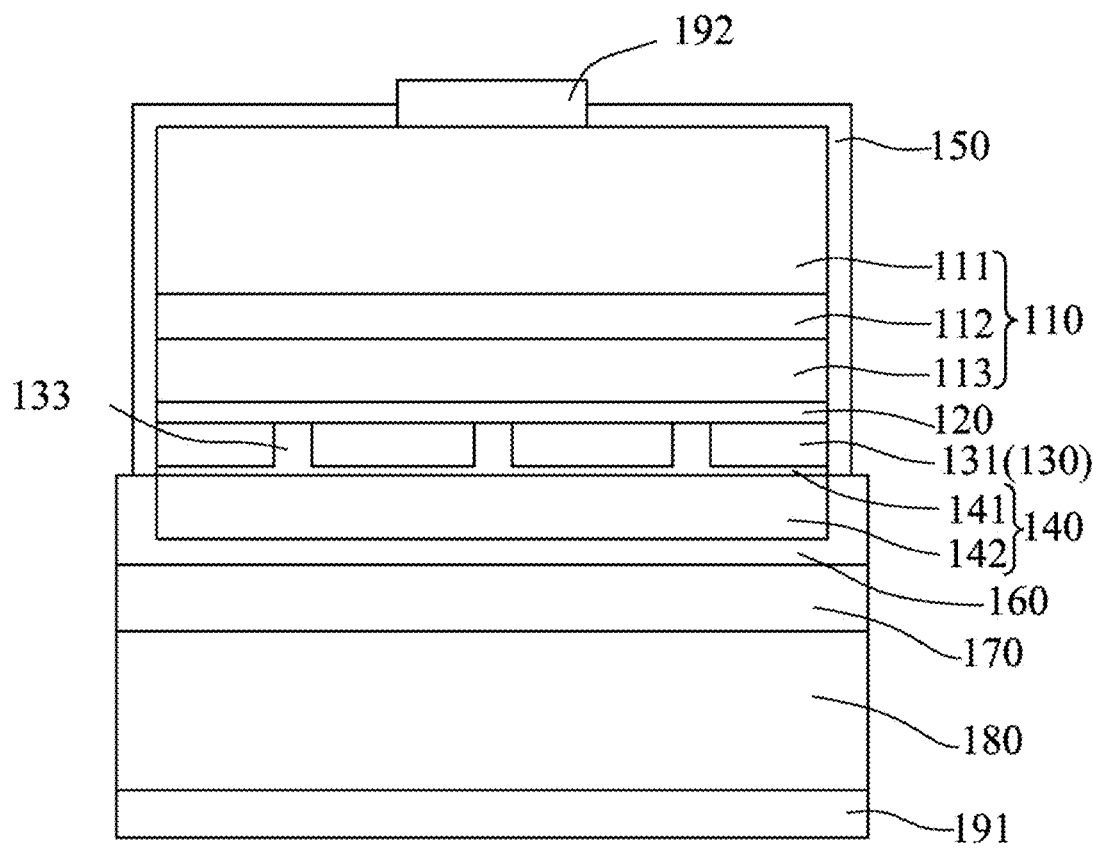
FIG. 1 is a schematic view illustrating a first embodiment of a light-emitting diode (LED) according to the disclosure.

Before the disclosure is described in greater detail, it should be noted that where considered appropriate, reference numerals have been repeated among the figures to indicate corresponding or analogous elements, which may optionally have similar characteristics.

It should be noted that, directional terms, such as "vertical," "horizontal," "top," "bottom," "upper," "lower," "inner," "inwardly," "outer," and "outwardly," "front," "rear," "left," "right", "top" and "bottom," may be used to assist in describing the disclosure based on the orientation of the embodiments shown in the illustrations. The use of these directional definitions should not be interpreted to limit the disclosure in any way.

Referring to FIG. 1, a first embodiment of a light-emitting diode (LED) according to the disclosure includes a substrate 180, a conductive mirror structure 140, a light-transmissive structure 130, and an epitaxial layered structure 110. The substrate 180 may be made of a material having a desired heat dissipation property, such as Si, Cu, ceramics, etc.

The epitaxial layered structure 110 includes a first semiconductor layer 111, an active layer 112 disposed on the first semiconductor layer 111, and a second semiconductor layer 113 disposed on the active layer 112 opposite to the first semiconductor layer 111. The first semiconductor layer 111 is one of an N-type semiconductor layer and a P-type semiconductor layer, and the second semiconductor layer 113 is the other one of the N-type semiconductor layer and the P-type semiconductor layer. The active layer 112 may include a multiple quantum well structure, and may be made of a predetermined material based on a desired wavelength of light to be emitted therefrom. In this embodiment, the active layer 112 emits light having a wavelength within a range of 350 nm to 450 nm (such as 350 nm to 400 nm).

The conductive mirror structure 140 includes a first electrically conductive layer 141 which is disposed on the second semiconductor layer 113 opposite to the active layer 112, and a second electrically conductive layer 142 which is disposed on the first electrically conductive layer 141 opposite to the epitaxial layered structure 110.

Each of the first and second electrically conductive layers 141, 142 may be made of a metallic material having a high electrical conductivity. Examples of the metallic materials include, but are not limited to, Ag, Ni, Al, Rh, Pd, Ir, Ru, Mg, Zn, Pt, Au, and Hf. In addition, the first electrically conductive layer 141 may be made of the material that can exhibit an improved adhesion to the light-transmissive structure 130, and an excellent light reflection property. In certain embodiments, the first electrically conductive layer 141 is made of Al or Rh. The first electrically conductive layer 141 may be a noncontinuous layer that has a thickness of not greater than 50 Å (e.g., 1 Å to 10 Å). The second electrically conductive layer 142 may have a thickness within a range of 100 Å to 5000 Å (e.g., 2000 Å). As such, the second electrically conductive layer 142 may play a major role in performing light reflection in the conductive mirror structure 140.

The first and second electrically conductive layers 141, 142 respectively have a first reflectance R1 and a second reflectance R2 to light emitted from the epitaxial layered structure 110. A combination of the first and second electrically conductive layer 141, 142 has a third reflectance R3 to light emitted from the epitaxial layered structure 110. The first to third reflectances R1, R2, R3 satisfy relationships of R1<R2, and (R2−R3)/R2<4%.

In this embodiment, the first electrically conductive layer 141 is made of Al, and the second electrically conductive layer 142 is made of Ag, since Al and Ag each have a relatively higher reflectance to light having a wavelength ranging from 360 nm to 450 nm. The reflectances of each of the materials to light having different wavelengths (i.e., within the range of 360 nm to 450 nm) are shown in Table 1 below and FIG. 2.

TABLE 1

| Wavelength (nm) | R2 (Ag) | R3 (Al—Ag) | (R2 − R3)/R2 | R3' (ITO-Ag) | (R3 − R3')/R3' |
|---|---|---|---|---|---|
| 450 | 93.64 | 96.26 | 2.80% | 93.56 | 0.08% |
| 449 | 93.62 | 96.25 | 2.80% | 93.52 | 0.11% |
| 448 | 93.61 | 96.24 | 2.81% | 93.47 | 0.15% |
| 447 | 93.58 | 96.21 | 2.80% | 93.40 | 0.20% |
| 446 | 93.57 | 96.18 | 2.79% | 93.34 | 0.25% |
| 445 | 93.53 | 96.16 | 2.80% | 93.29 | 0.27% |
| 444 | 93.54 | 96.14 | 2.78% | 93.24 | 0.32% |
| 443 | 93.49 | 96.12 | 2.81% | 93.17 | 0.35% |
| 442 | 93.49 | 96.10 | 2.80% | 93.12 | 0.39% |
| 441 | 93.46 | 96.07 | 2.79% | 93.04 | 0.45% |
| 440 | 93.44 | 96.07 | 2.81% | 92.98 | 0.49% |
| 439 | 93.39 | 96.02 | 2.82% | 92.90 | 0.53% |
| 438 | 93.38 | 96.00 | 2.80% | 92.84 | 0.58% |
| 437 | 93.35 | 95.99 | 2.82% | 92.76 | 0.64% |
| 436 | 93.34 | 95.95 | 2.80% | 92.69 | 0.70% |
| 435 | 93.30 | 95.92 | 2.81% | 92.63 | 0.73% |
| 434 | 93.30 | 95.91 | 2.79% | 92.55 | 0.81% |
| 433 | 93.26 | 95.87 | 2.80% | 92.46 | 0.87% |
| 432 | 93.22 | 95.83 | 2.80% | 92.36 | 0.93% |
| 431 | 93.22 | 95.81 | 2.78% | 92.29 | 1.01% |
| 430 | 93.19 | 95.79 | 2.80% | 92.22 | 1.05% |
| 429 | 93.14 | 95.74 | 2.79% | 92.13 | 1.10% |
| 428 | 93.11 | 95.72 | 2.81% | 92.01 | 1.19% |
| 427 | 93.09 | 95.69 | 2.80% | 91.93 | 1.26% |

TABLE 1-continued

| Wavelength (nm) | R2 (Ag) | R3 (Al—Ag) | (R2 − R3)/R2 | R3' (ITO-Ag) | (R3 − R3')/R3' |
|---|---|---|---|---|---|
| 426 | 93.04 | 95.67 | 2.82% | 91.83 | 1.32% |
| 425 | 93.01 | 95.63 | 2.82% | 91.72 | 1.41% |
| 424 | 92.99 | 95.58 | 2.79% | 91.62 | 1.49% |
| 423 | 92.94 | 95.55 | 2.81% | 91.52 | 1.55% |
| 422 | 92.91 | 95.53 | 2.82% | 91.42 | 1.63% |
| 421 | 92.86 | 95.47 | 2.81% | 91.30 | 1.71% |
| 420 | 92.84 | 95.43 | 2.79% | 91.21 | 1.79% |
| 419 | 92.82 | 95.42 | 2.80% | 91.08 | 1.92% |
| 418 | 92.78 | 95.36 | 2.78% | 90.96 | 1.99% |
| 417 | 92.75 | 95.32 | 2.78% | 90.84 | 2.10% |
| 416 | 92.70 | 95.29 | 2.79% | 90.72 | 2.19% |
| 415 | 92.64 | 95.25 | 2.81% | 90.57 | 2.29% |
| 414 | 92.58 | 95.18 | 2.81% | 90.47 | 2.33% |
| 413 | 92.58 | 95.13 | 2.76% | 90.33 | 2.48% |
| 412 | 92.54 | 95.11 | 2.78% | 90.21 | 2.58% |
| 411 | 92.50 | 95.06 | 2.77% | 90.07 | 2.69% |
| 410 | 92.44 | 95.00 | 2.78% | 89.93 | 2.79% |
| 409 | 92.39 | 94.95 | 2.77% | 89.76 | 2.93% |
| 408 | 92.33 | 94.91 | 2.80% | 89.63 | 3.01% |
| 407 | 92.32 | 94.84 | 2.73% | 89.51 | 3.14% |
| 406 | 92.24 | 94.79 | 2.77% | 89.33 | 3.26% |
| 405 | 92.18 | 94.72 | 2.76% | 89.18 | 3.36% |
| 404 | 92.11 | 94.67 | 2.78% | 89.04 | 3.45% |
| 403 | 92.04 | 94.59 | 2.77% | 88.85 | 3.59% |
| 402 | 91.96 | 94.52 | 2.78% | 88.68 | 3.70% |
| 401 | 91.93 | 94.49 | 2.79% | 88.55 | 3.82% |
| 400 | 91.86 | 94.44 | 2.80% | 88.38 | 3.94% |
| 399 | 91.76 | 94.38 | 2.85% | 88.20 | 4.04% |
| 398 | 91.71 | 94.27 | 2.78% | 88.00 | 4.22% |
| 397 | 91.57 | 94.15 | 2.82% | 87.78 | 4.31% |
| 396 | 91.55 | 94.13 | 2.81% | 87.66 | 4.44% |
| 395 | 91.41 | 94.02 | 2.85% | 87.37 | 4.63% |
| 394 | 91.37 | 93.93 | 2.80% | 87.22 | 4.76% |
| 393 | 91.24 | 93.83 | 2.84% | 86.96 | 4.91% |
| 392 | 91.20 | 93.73 | 2.77% | 86.83 | 5.04% |
| 391 | 91.05 | 93.62 | 2.82% | 86.53 | 5.22% |
| 390 | 90.94 | 93.53 | 2.85% | 86.30 | 5.37% |
| 389 | 90.86 | 93.44 | 2.84% | 86.08 | 5.55% |
| 388 | 90.79 | 93.34 | 2.81% | 85.81 | 5.80% |
| 387 | 90.62 | 93.21 | 2.86% | 85.57 | 5.90% |
| 386 | 90.48 | 93.11 | 2.90% | 85.33 | 6.03% |
| 385 | 90.37 | 92.91 | 2.82% | 85.05 | 6.25% |
| 384 | 90.21 | 92.78 | 2.85% | 84.78 | 6.41% |
| 383 | 90.06 | 92.66 | 2.88% | 84.47 | 6.62% |
| 382 | 89.93 | 92.56 | 2.92% | 84.19 | 6.82% |
| 381 | 89.77 | 92.41 | 2.94% | 83.90 | 6.99% |
| 380 | 89.67 | 92.31 | 2.94% | 83.59 | 7.27% |
| 379 | 89.41 | 92.13 | 3.04% | 83.25 | 7.41% |
| 378 | 89.17 | 91.86 | 3.02% | 82.87 | 7.60% |
| 377 | 89.10 | 91.81 | 3.04% | 82.58 | 7.89% |
| 376 | 88.84 | 91.54 | 3.04% | 82.19 | 8.09% |
| 375 | 88.66 | 91.38 | 3.07% | 81.89 | 8.26% |
| 374 | 88.36 | 91.13 | 3.14% | 81.51 | 8.40% |
| 373 | 88.08 | 90.85 | 3.15% | 81.07 | 8.65% |
| 372 | 87.87 | 90.64 | 3.16% | 80.74 | 8.83% |
| 371 | 87.56 | 90.34 | 3.17% | 80.30 | 9.04% |
| 370 | 87.35 | 90.09 | 3.14% | 79.92 | 9.30% |
| 369 | 87.01 | 89.83 | 3.24% | 79.52 | 9.41% |
| 368 | 86.66 | 89.50 | 3.27% | 79.13 | 9.52% |
| 367 | 86.22 | 89.21 | 3.46% | 78.70 | 9.55% |
| 366 | 85.80 | 88.82 | 3.51% | 78.27 | 9.62% |
| 365 | 85.59 | 88.55 | 3.46% | 77.92 | 9.85% |
| 364 | 85.05 | 88.05 | 3.54% | 77.39 | 9.89% |
| 363 | 84.64 | 87.62 | 3.52% | 77.04 | 9.88% |
| 362 | 84.13 | 87.14 | 3.58% | 76.70 | 9.69% |
| 361 | 83.71 | 86.70 | 3.57% | 76.33 | 9.66% |
| 360 | 83.03 | 86.03 | 3.61% | 75.94 | 9.34% |

The LED may further include a light-transmissive structure 130 which includes a first dielectric layer 131 disposed between the epitaxial layered structure 110 and the conductive mirror structure 140. The light-transmissive structure 130 may be made of a material that is transparent to the light emitted from the active layer 112, such as magnesium fluoride ($MgF_2$), magnesium oxide (MgO), aluminum oxide ($Al_2O_3$), silicon oxide (e.g., $SiO_2$), titanium dioxide ($TiO_2$), tantalum pentoxide ($Ta_2O_5$), silicon nitride ($SiN_x$), etc. In this embodiment, the light-transmissive structure 130 is made of silicon oxide. The light-transmissive structure 130 may have a thickness that is equal to or greater than 50 nm (such as 50 nm to 500 nm). The first dielectric layer 131, the first electrically conductive layer 141, and the second electrically conductive layer 142 cooperatively form an omnidirectional reflector. In certain embodiments, the light-transmissive structure 130 is formed with a plurality of through holes 133, and the first electrically conductive layer 141 fills the through holes 133 so as to electrically connect to the epitaxial layered structure 110.

The LED may further include a transparent conductive layer 120 which is formed between the epitaxial layered structure 110 and the light-transmissive structure 130. The transparent conductive layer 120 may be made of a semiconductor material or a transparent electrically conductive oxide. Examples of the transparent electrically conductive oxide may include, but are not limited to, indium tin oxide (ITO), indium oxide (InO), tin oxide (SnO), zinc oxide (ZnO), and indium zinc oxide (IZO).

To prevent diffusion of metal atoms of the second electrically conductive layer 142, the LED may further include a metallic protective layer 160 which is disposed between the second electrically conductive layer 142 and the substrate 180, and covers side portions of the second electrically conductive layer 142. In certain embodiments, the metallic protective layer 160 is made of a relatively stable metallic material such as Ti, Pt, Au, Cr, and TiW. The metallic protective layer 160 may be a single-layer structure or a multiple-layered structure.

The LED may further include a bonding layer 170 to bond the epitaxial layered structure 110 to the substrate 180. In this embodiment, the bonding layer 170 improves a bonding strength between the metallic protective layer 160 and the substrate 180 through, e.g., Au—Au bonding and Au—In bonding.

The LED may further include a top electrode 192 that is disposed on the first semiconductor layer 111, and a back electrode 191 that is disposed on the substrate 180 opposite to the epitaxial layered structure 110. In certain embodiments, the LED further includes an insulating protective layer 150 which enwraps the epitaxial layered structure 110.

Figure 2:
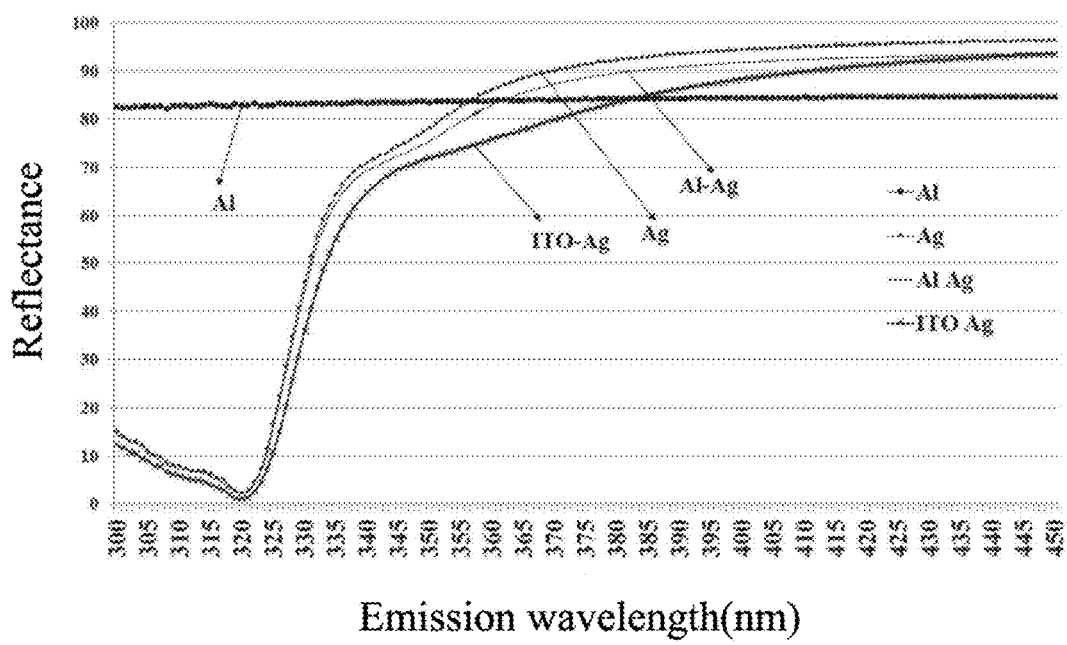
FIG. 2 is a graph showing spectral reflectance of different materials at a wavelength ranging from 300 nm to 450 nm.

Referring to Table 1 and FIG. 2, it can be observed that, the reflectance of Al (i.e., R1) to light having an emission wavelength within the range of 360 nm to 450 nm is smaller than the reflectance of Ag (i.e., R2), and the curves of spectral reflectance of Ag (i.e., R2) and Al—Ag (i.e., R3) to light having an emission wavelength within the range of 360 nm to 430 nm are substantially parallel to each other, with a difference therebetween being not greater than 4%. In addition, the reflectance of Al—Ag (i.e., R3) is not lower than 851 when the emission wavelength of light is within a range of about 365 nm to 450 nm, and R3 is even equal to or greater than 90% when the emission wavelength of light is within a range of about 385 nm to 450 nm.

Further, the reflectance of Al—Ag (i.e., R3) to light having an emission wavelength within the range of 345 nm to 410 nm is significantly greater than that of ITO-Ag (denoted as R3'), which is a comparative group with an ITO layer serving as the first electrically conductive layer 141. In particular, when the emission wavelength of light is within a range of about 365 nm to 450 nm, a percentage of improvement in the reflectance of Al—Ag (i.e., R3) relative to the reflectance of ITO-Ag (R3') can be 44 to 9%.

By virtue of the structural and material design of the first and second electrically conductive layers 141, 142 in the conductive mirror structure 140, the light extraction efficiency of the LED according to this disclosure may be improved, and a bonding strength between the light-transmissive structure 130 and the conductive mirror structure 140 may be increased.

Figure 3:
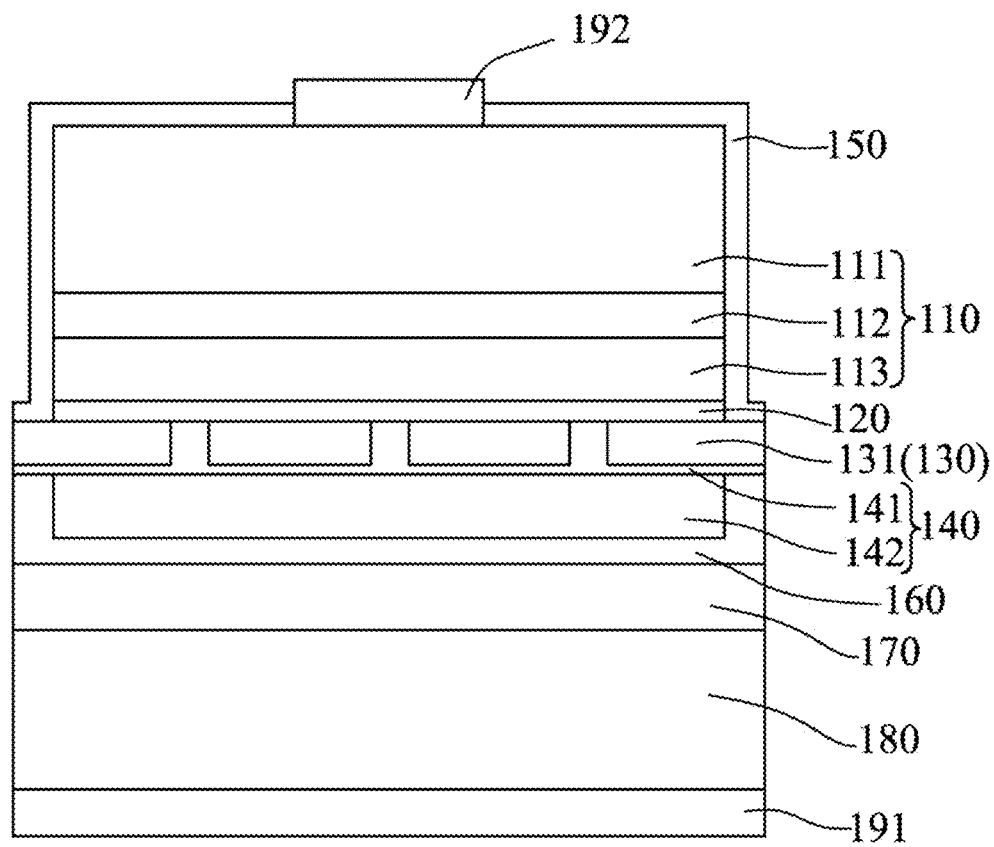
FIG. 3 is a schematic view illustrating a second embodiment of the LED according to the disclosure.
Figure 4:
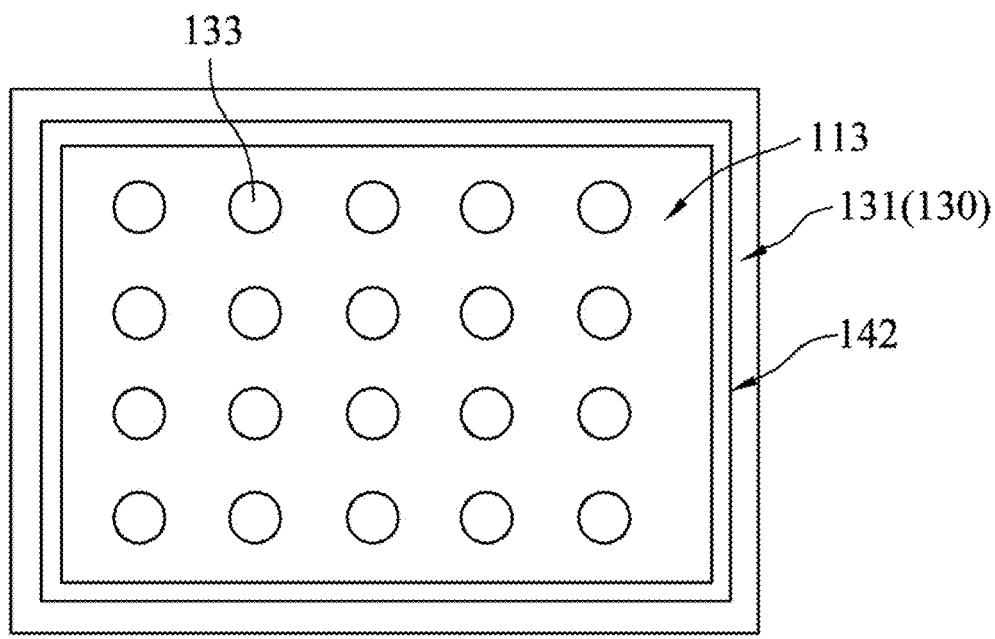
FIG. 4 is a schematic top view of the second embodiment illustrating a projection of an epitaxial layered structure on a first conductivity layer which falls within a projection of a second electrically conductive layer on a first electrically conductive layer.

Referring to FIGS. 3 and 4, a second embodiment of the LED according to the disclosure is similar to the first embodiment except that in the second embodiment, a projection of the second electrically conductive layer 142 on the first electrically conductive layer 141 has an area which is greater than that in the first embodiment. In addition, a projection of the epitaxial layered structure 110 on the first electrically conductive layer 141 falls within the projection of the second electrically conductive layer 142 on the first electrically conductive layer 141, and an area of the projection of the epitaxial layered structure 110 on the first electrically conductive layer 141 is not greater than the area of the projection of the second electrically conductive layer 142 on the first electrically conductive layer 141. A distance from a side of the projection of the second electrically conductive layer 142 on the first electrically conductive layer 141 to a nearest side of the projection of the epitaxial layered structure 110 on the first electrically conductive layer 141 may range from 0 μm to 50 μm (e.g., 10 μm to 20 μm). As such, light emitted from the epitaxial layered structure 110 may be reflected more efficiently by the second electrically conductive layer 142, thereby increasing the light extraction efficiency and luminance of the LED of this disclosure.

Figure 5:
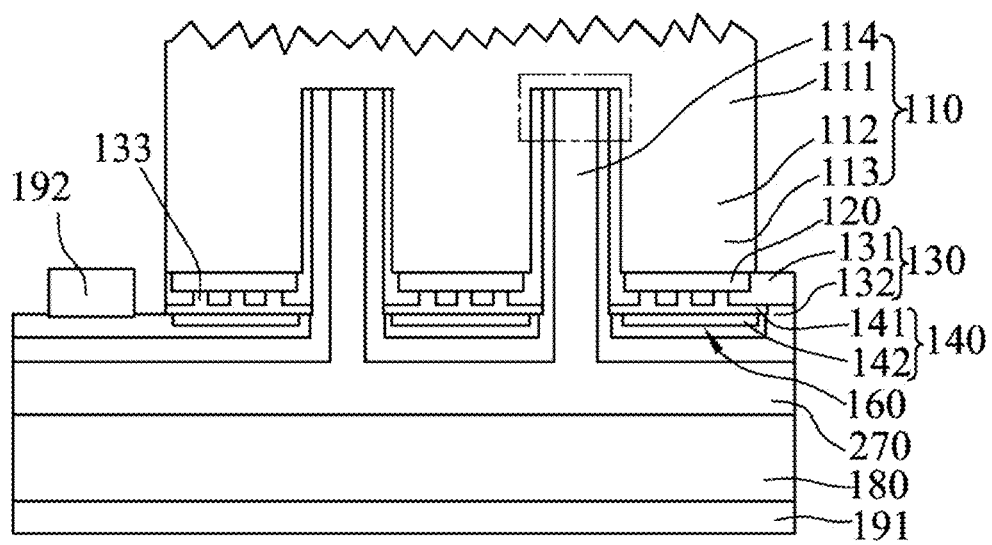
FIG. 5 is a schematic view illustrating a third embodiment of the LED according to the disclosure.

Referring to FIG. 5, a third embodiment of the LED according to the disclosure is similar to the first embodiment except for the following differences.

Specifically, in the third embodiment, the epitaxial layered structure 110 is formed with at least one indentation 114 which extends through the active layer 112 and the second semiconductor layer 113 and which terminates at the first semiconductor layer 111 to expose the first semiconductor layer 111. When the first semiconductor layer 111 has a relatively small thickness (e.g., lower than 2 μm), the indentation 114 of the epitaxial layered structure 110 may only extend through the active layer 112 and the second semiconductor layer 113 to expose a surface of the first semiconductor layer 111 proximal to the active layer 112. When the first semiconductor layer 111 has a relatively large thickness (e.g., at least 2 μm), the indentation 114 may further extend into the first semiconductor layer 111, so as to improve dissipation of heat that is generated from the active layer 112 and that accumulates in the first semiconductor layer 111. For example, when the first semiconductor layer 111 has a thickness ranging from 2 μm to 3 μm, the indentation 114 may extend at least 1 μm into the first semiconductor layer 111. In addition, in this embodiment, a surface of the first semiconductor layer 111 opposite to the active layer 112 is roughened.

The light-transmissive structure 130 further includes a second dielectric layer 132 which is disposed on the first dielectric layer 131 and the metallic protective layer 160. The second dielectric layer 132 may be made of an electrically insulating material such as, but is not limited to, $MgF_2$, MgO, $Al_2O_3$, $SiO_x$, $TiO_2$, $Ta_2O_5$, $SiN_x$, etc. The first and second dielectric layers 131, 132 may be made of an identical material or different materials. The first dielectric layer 131 in this embodiment may have a thickness of not greater than 5000 Å. In addition, the light-transmissive structure 130 may cover a side wall of the epitaxial layered structure 110 exposed from the indentation 114.

In addition, the LED further includes an electrically conductive connecting layer 270 which is disposed between the second electrically conductive layer 142 opposite to the first electrically conductive layer 141 and the substrate 180. The electrically conductive connecting layer 270 fills the indentation 114 to be electrically connected with the first semiconductor layer 111, and may serve as a heat conducting channel between the substrate 180 and the first semiconductor layer 111, so as to direct heat from the first semiconductor layer 111 into the substrate 180. The electrically conductive connecting layer 270 may include a reflective material (e.g., Al, Cr, Ag) and an adhesive material for bonding to the substrate 180. Therefore, the bonding layer 170 used in the first embodiment may be omitted.

The top electrode 192 is electrically connected to the first semiconductor layer 111 via the electrically conductive connecting layer 270. The back electrode 191 is formed on an exposed portion of the metallic protective layer 160, and is electrically connected to the second semiconductor layer 113 via the metallic protective layer 160, the second electrically conductive layer 142, the first electrically conductive layer 141, and the transparent conductive layer 120.

Figure 6:
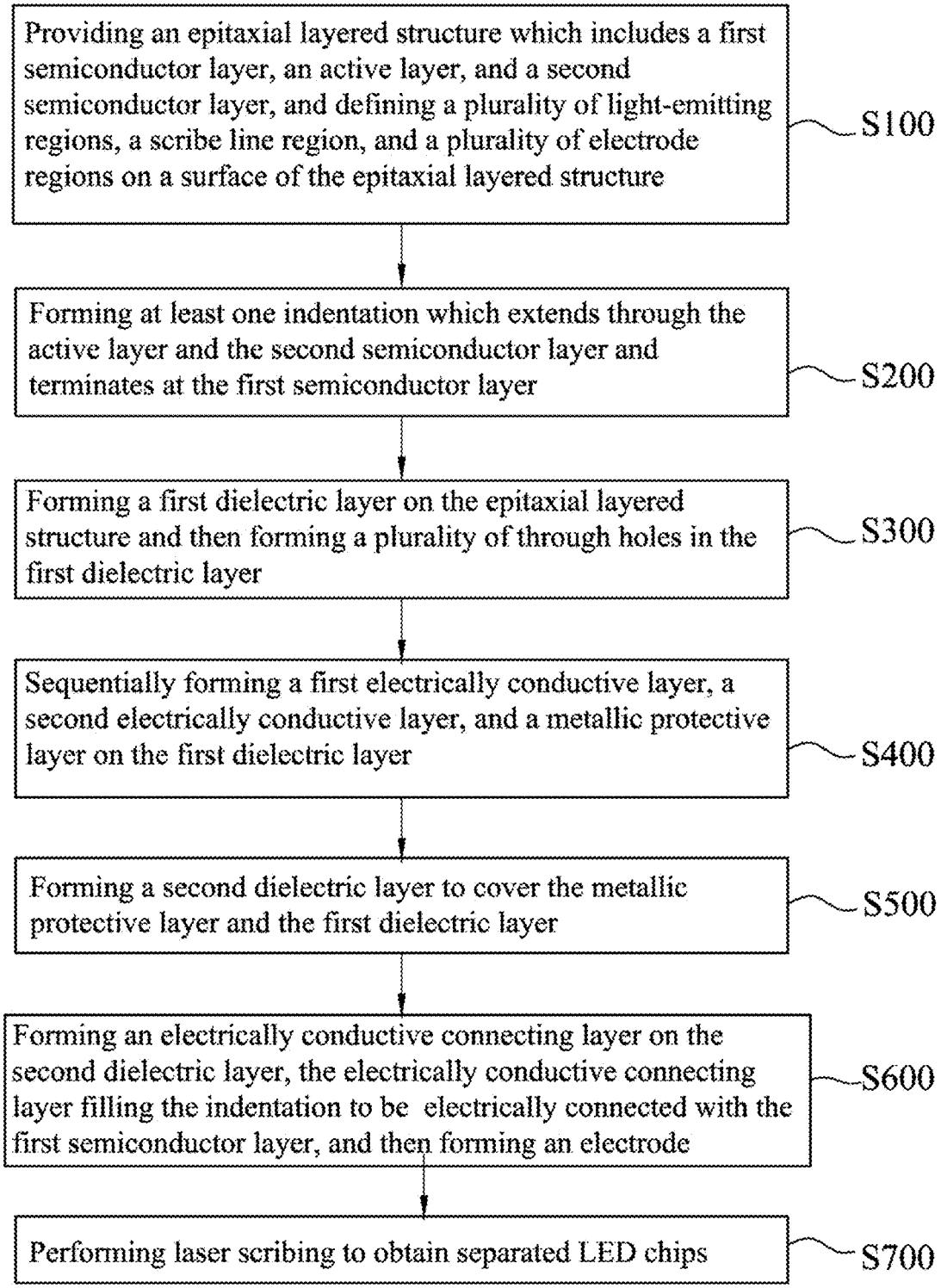
FIG. 6 is a flow chart illustrating a method for manufacturing the third embodiment of the LED according to the disclosure.

Referring to FIG. 6, a method for manufacturing the third embodiment of the LED includes the following consecutive steps S100 to S700.

Figure 7:
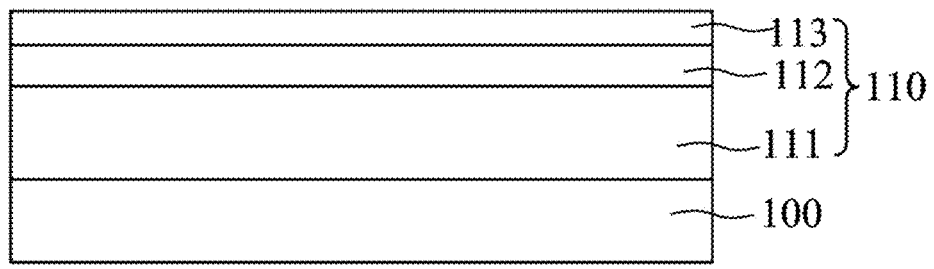
FIGS. 7 to 19 are schematic views illustrating consecutive steps of the method of FIG. 6.
Figure 8:
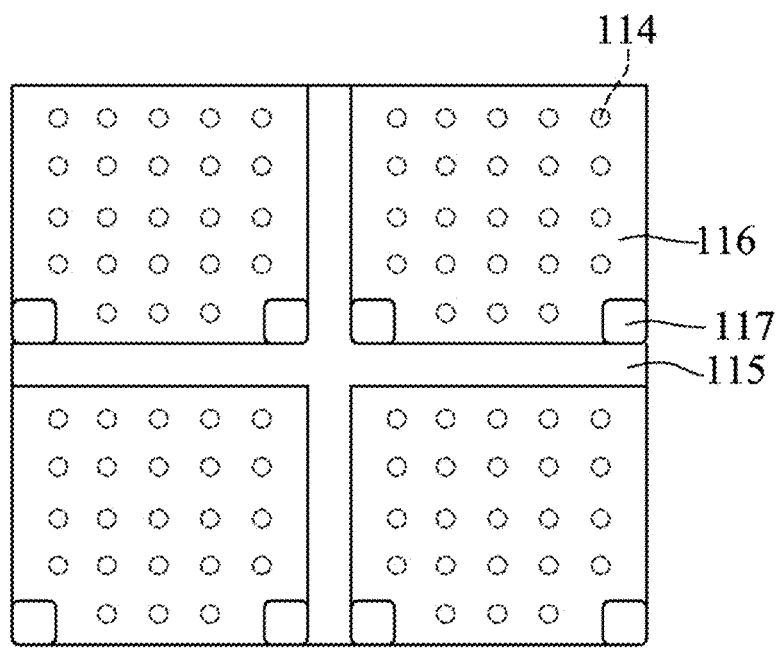

Referring to FIGS. 7 and 8, in step S100, the epitaxial layered structure 110 is provided on a growth substrate 100, and a scribe line region 115, a plurality of light-emitting regions 116 separated by the scribe line region 115, and a plurality of electrode regions 117 are defined on a surface of the epitaxial layered structure 110 opposite to the growth substrate 100. To be specific, the epitaxial layered structure 110 includes the first semiconductor layer 111, the active layer 112, and the second semiconductor layer 113 which are stacked on the growth substrate 100 in such order. The growth substrate 100 may be made of a material such as, but is not limited to, sapphire, aluminum nitride, gallium nitride, silicon, silicon carbide, gallium arsenide, etc., and may have a planar structure or a patterned structure. Each of the light-emitting regions 116 defines a respective one of LED chips to be formed, and includes at least one of the electrode regions 117 (see FIG. 8).

Figure 9:
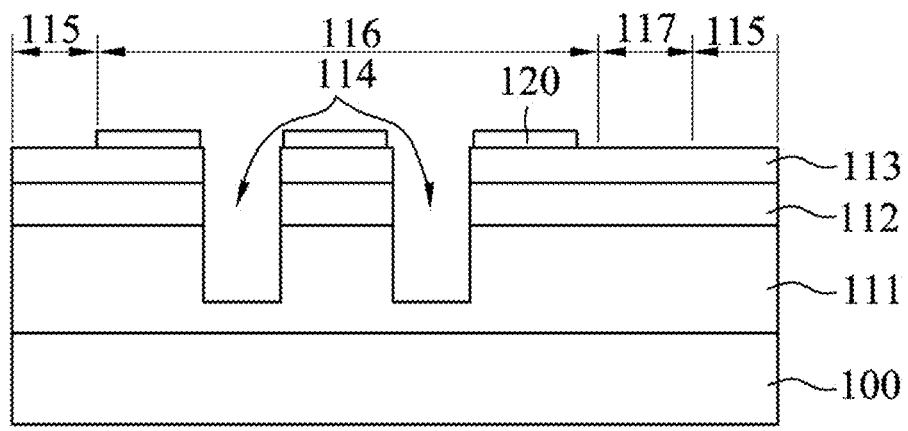

Referring to FIG. 9, in step S200, the epitaxial layered structure 110 is etched to form a plurality of the indentations 114 each extending through the active layer 112 and the second semiconductor layer 113 and terminating at the first semiconductor layer 111 so as to expose a side wall of the epitaxial layered structure 110 and the first semiconductor layer 111. Then, the transparent conductive layer 120 is optionally formed on the light-emitting regions 116 of the epitaxial layered structure 110.

Figure 10:
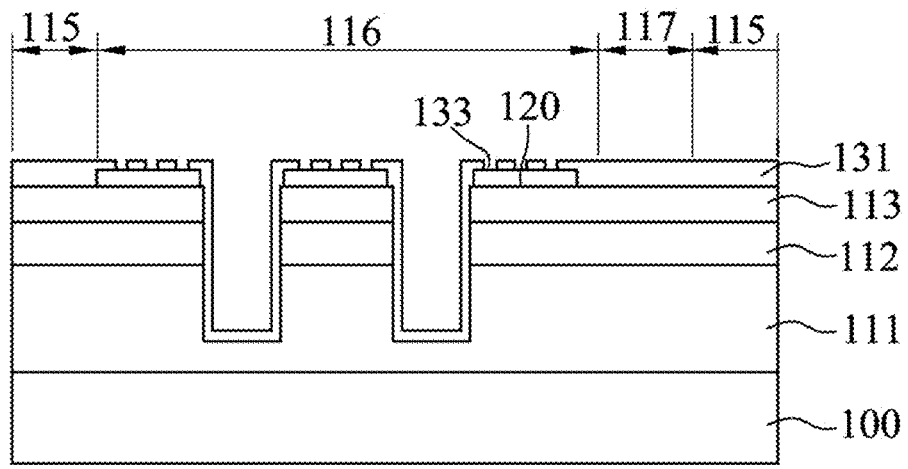

Referring to FIG. 10, in step S300, the first dielectric layer 131 is formed on the epitaxial layered structure 110 such that the scribe line region 115 and the light-emitting regions 116 of the epitaxial layered structure 110, as well as the exposed side wall of the epitaxial layered structure 110 and the exposed first semiconductor layer 111 are covered by the first dielectric layer 131. Then, a plurality of the through holes 133 are formed in the first dielectric layer 131 to partially expose the transparent conductive layer 120.

Figure 11:
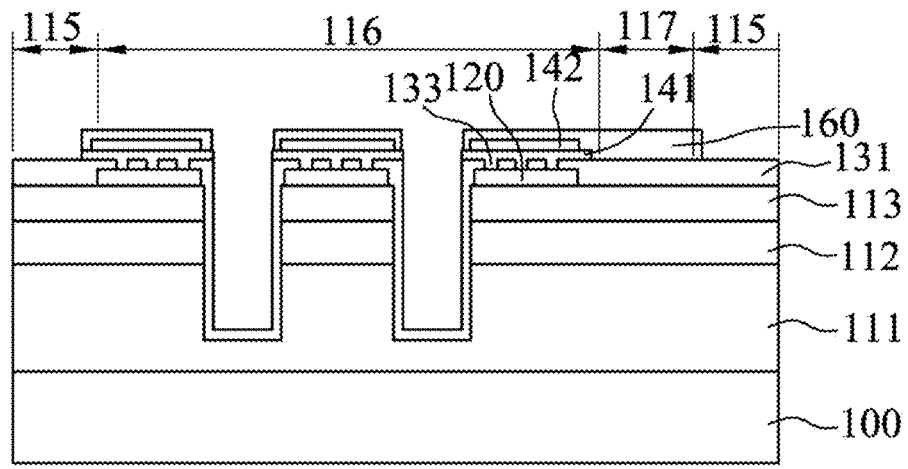

Further referring to FIG. 11, in step S400, the conductive mirror structure 140 and the metallic protective layer 160 are sequentially formed on the first dielectric layer 131. To be specific, the conductive mirror structure 140 is a double-layered structure which includes the first electrically conductive layer 141 that fills the through holes 133 of the first dielectric layer 131 to electrically connect to the transparent conductive layer 120, and the second electrically conductive layer 142 that is formed on the first electrically conductive layer 141. Then, the metallic protective layer 160 is disposed over the second electrically conductive layer 142 and extends towards the electrode region 117. The first electrically conductive layer 141 is made of Al, and the second electrically conductive layer 142 is made of Ag.

Alternatively, the conductive mirror structure 140 may be a single layer structure. For example, when a light emitted from the active layer 112 has a wavelength greater than 360 nm (such as 360 nm to 450 nm), the conductive mirror structure 140 may be an Ag mirror. To improve the adhesion between the Ag mirror and the first dielectric layer 131, an ITO layer serving as an adhesion layer may be further formed therebetween. When a light emitted from the active layer 112 has a wavelength of not greater than 360 nm, the conductive mirror structure may be an Al mirror or a Rh mirror.

Figure 12:
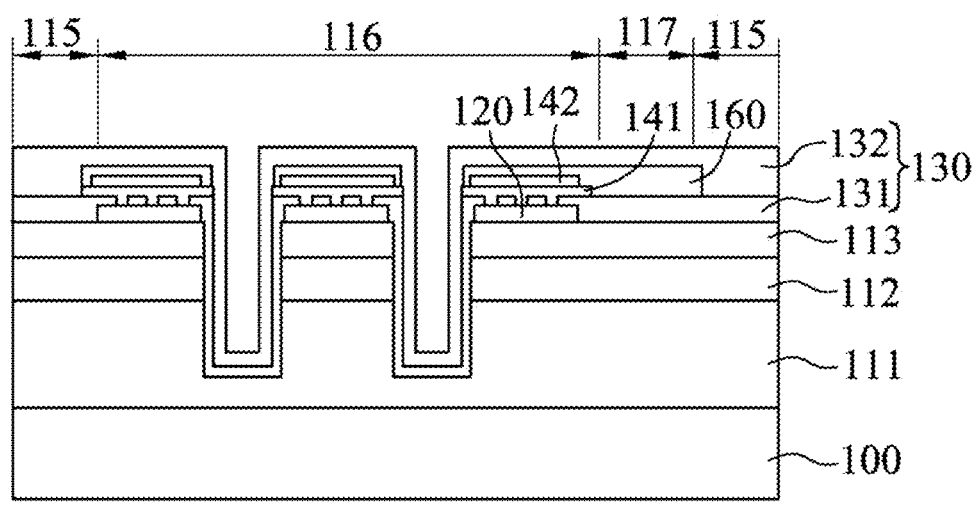
Figure 13:
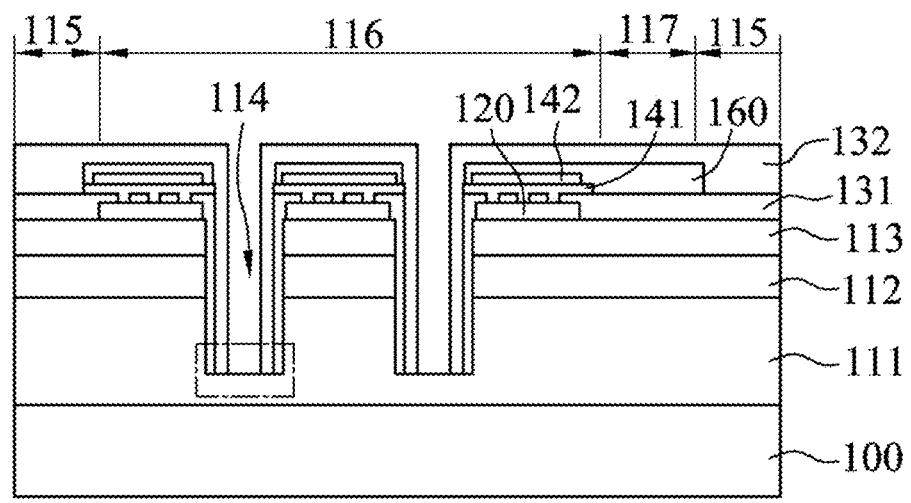

Referring to FIGS. 12 and 13, in step S500, the second dielectric layer 132 is formed to cover the first dielectric layer 131 on the scribe line region 115 and the metallic protective layer 160. The second dielectric layer 132 may also extend into the indentations 114 to cover the first dielectric layer 131 on the exposed side wall of the epitaxial layered structure 110 and the exposed first semiconductor layer 111. Then, portions of the first and second dielectric layer 131, 132 that cover the exposed first semiconductor layer 111 are removed so as to partially expose the first semiconductor layer 111.

Figure 14:
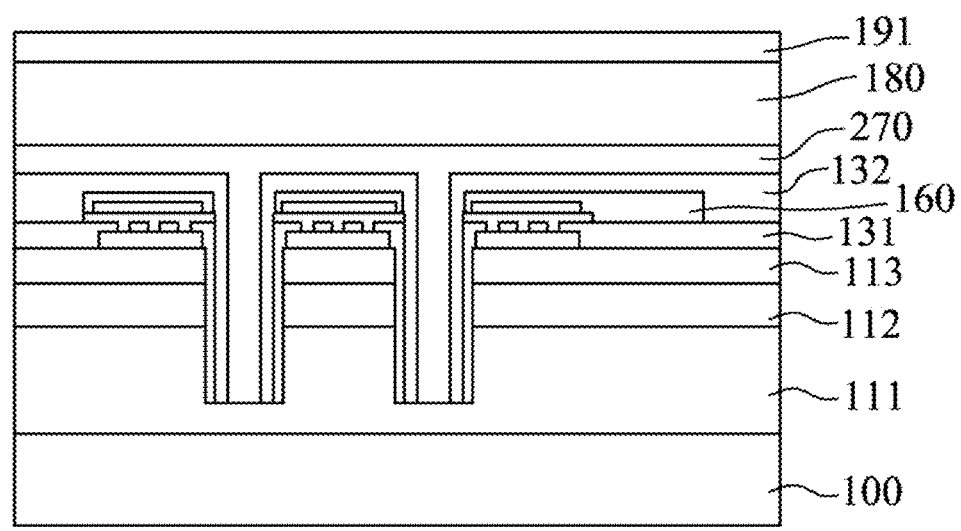
Figure 15:
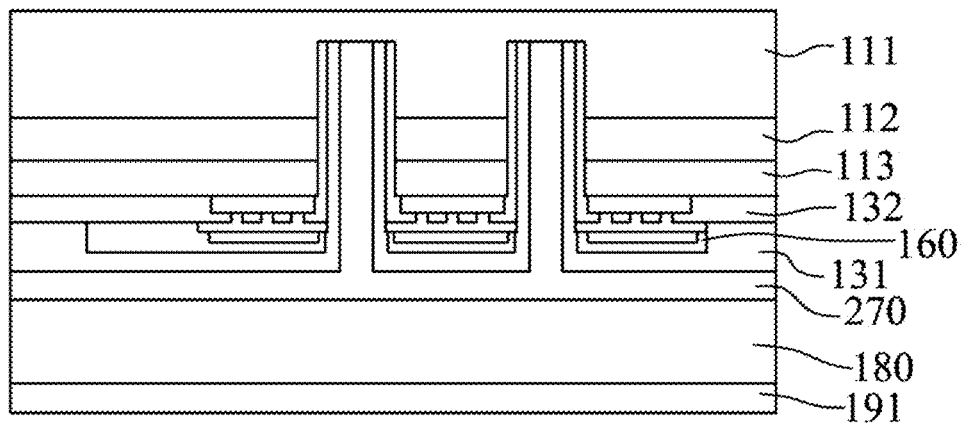
Figure 16:
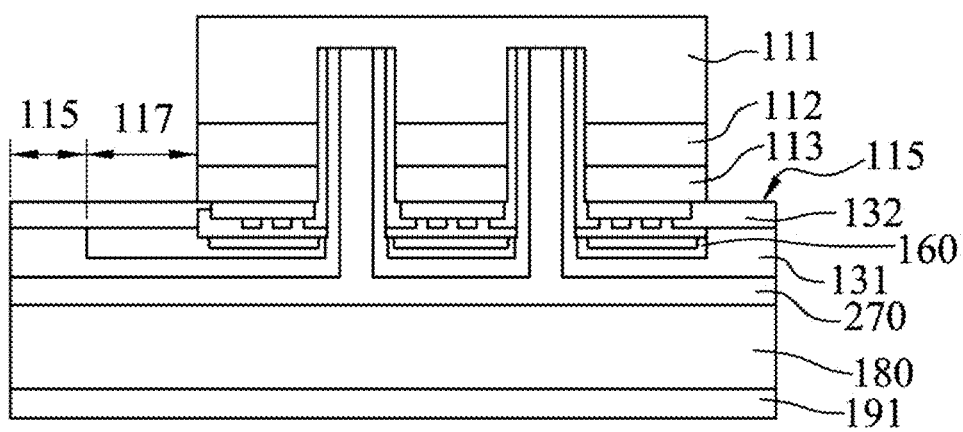
Figure 17:
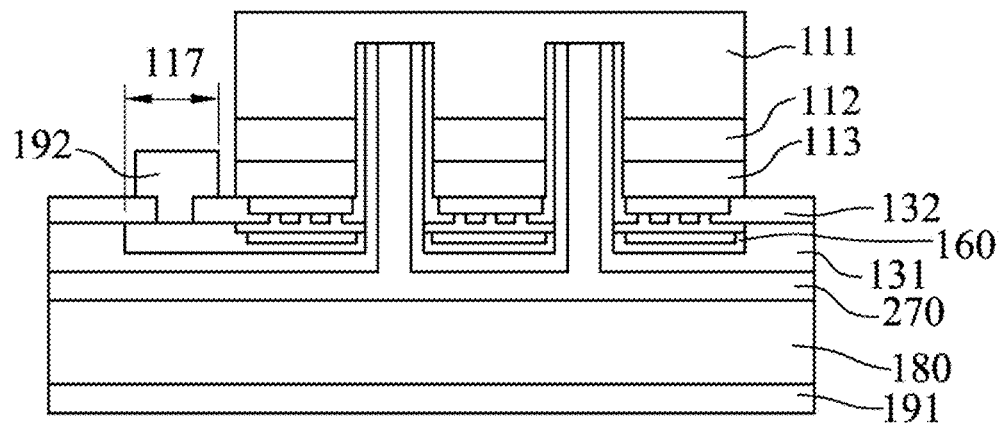
Figure 18:
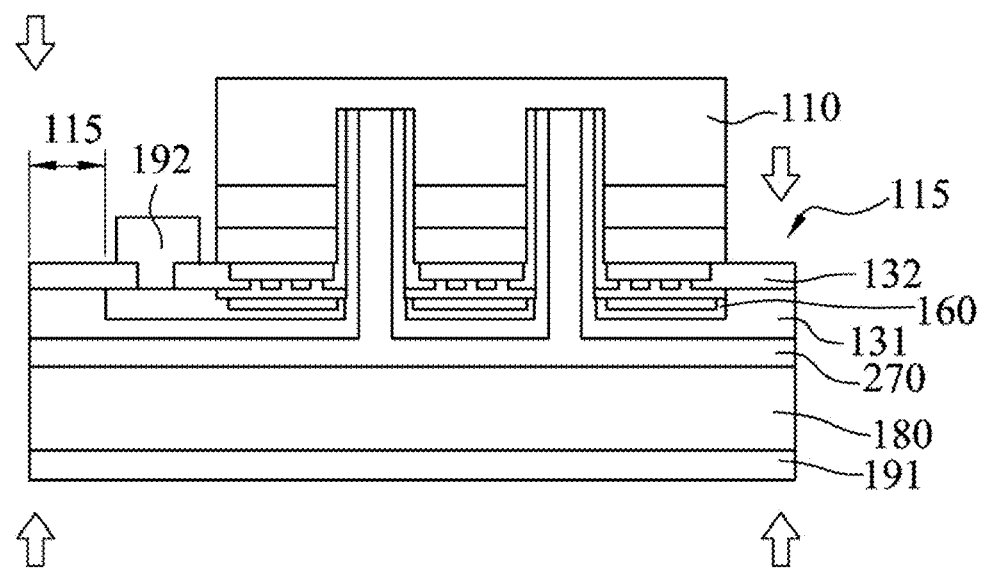
Figure 19:
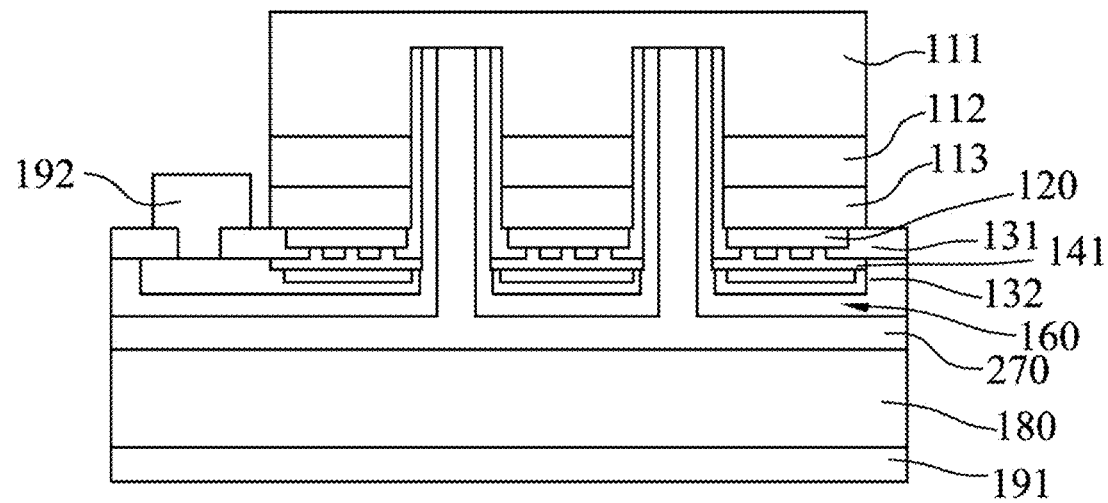

Referring to FIG. 14, in step S600, the electrically conductive connecting layer 270 is formed on the second dielectric layer 132 and fills the indentations 114 to electrically connect to the first semiconductor layer 111. Then, the substrate 180 is formed on the electrically conductive connecting layer 270, and the top electrode 192 is formed on the substrate 180 opposite to the electrically conductive connecting layer 270.

Referring to FIGS. 15 to 19, in step S700, laser scribing is performed to obtain a plurality of LED chips that are separated from one another. To be specific, the growth substrate 100 is first removed to expose a surface of the first semiconductor layer 111 opposite to the active layer 112 (see FIG. 15). Next, a portion of the epitaxial layered structure 110 on the scribe line region 115 and on the electrode region 117 is removed by an etching process to expose the first dielectric layer 131 (see FIG. 16). Thereafter, a portion of the exposed first dielectric layer 131 that corresponds in position to the electrode region 117 is etched to partially expose the metallic protective layer 160, and the back electrode 191 is formed on the exposed portion of the metallic protective layer 160 to obtain a semi-product (see FIG. 17). Finally, referring further to FIG. 18, the semi-product is subjected to laser scribing from both the top and bottom sides thereof, thereby obtaining the separated LED chips (see FIG. 19). A rough treatment may be further performed on the epitaxial layered structure 110, so as to obtain the third embodiment of the LED as shown in FIG. 5.

Figure 25:
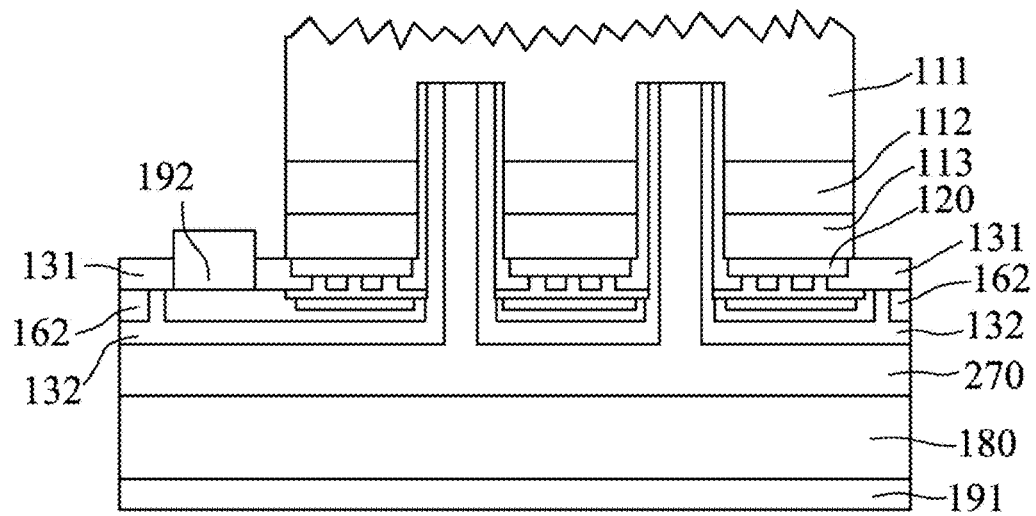

Referring to FIG. 25, a fourth embodiment of the LED according to the disclosure is similar to the third embodiment, except that in the fourth embodiment, the LED further includes a metallic layer 162 disposed between the first and second dielectric layers 131, 132. The metallic layer 162 may prevent heat accumulation in the first and second dielectric layers 131, 132 (which are generally made of electrically insulating materials such as silicon oxide, silicon nitride, etc.) during laser scribing. In certain embodiments, the metallic layer 162 is disposed outside a projection of the epitaxial layered structure 110 on the first dielectric layer 131, and is electrically isolated from the metallic protective layer 160. The metallic layer 162 and the metallic protective layer 160 may be made of an identical material or different materials. In this embodiment, the metallic protective layer 160 and the metallic layer 162 are made of the same material.

Referring to FIGS. 20 to 24, a method for manufacturing the fourth embodiment of the LED according to the disclosure is similar to the method for manufacturing the third embodiment, except for differences in steps S400 to S700 as described below.

Figure 20:
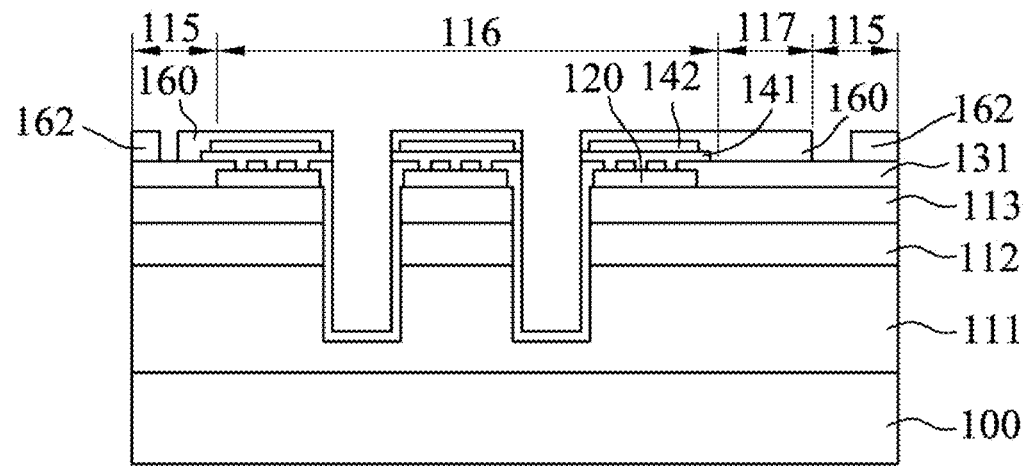
Figure 21:
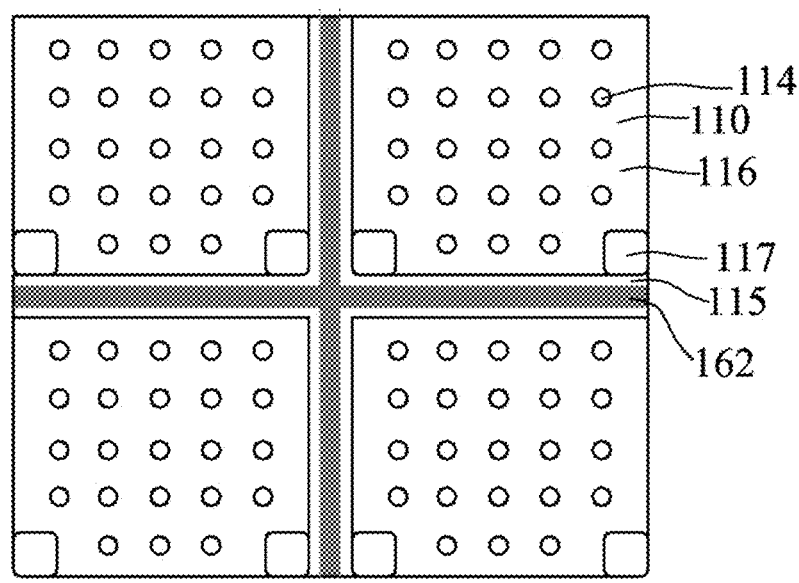
Figure 22:
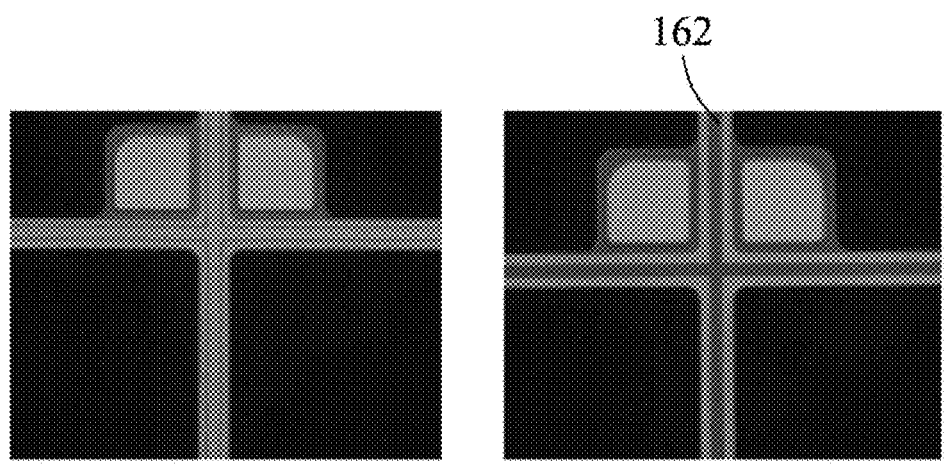
Figure 23:
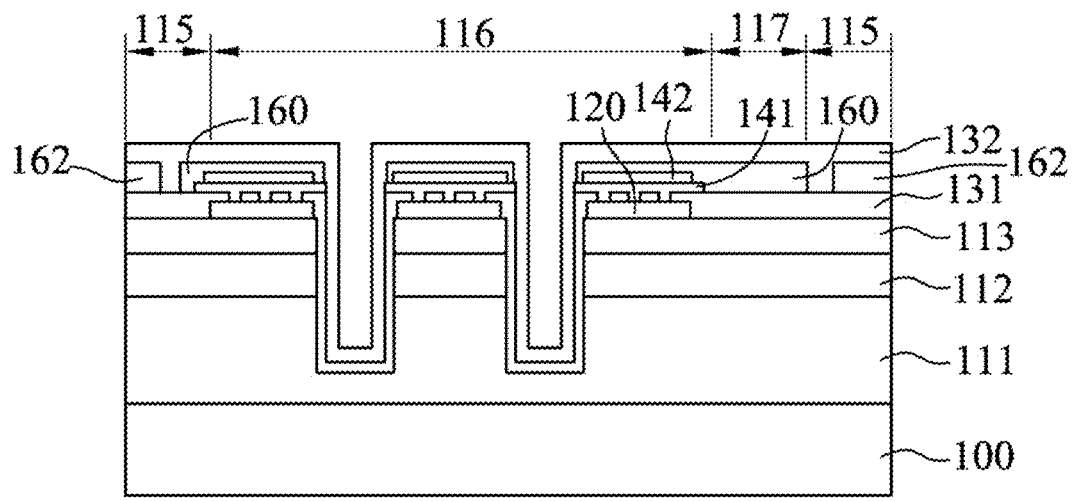
Figure 24:
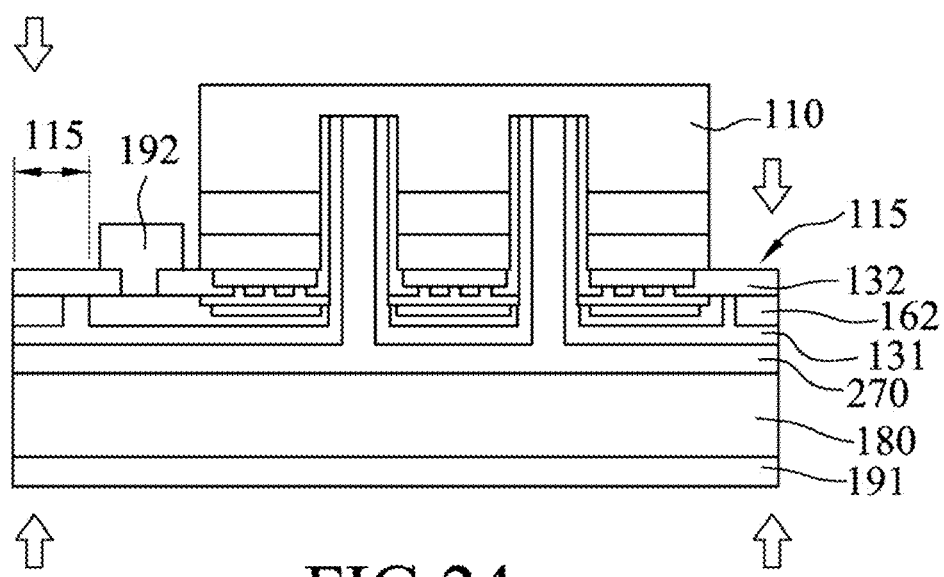

Referring further to FIGS. 20 and 21, in step S400, the metallic layer 162 is formed on the first dielectric layer 131 that is located in the scribe line region 115 (such as a central part of the scribe line region 115), and is spaced apart from the metallic protective layer 160. Referring again to FIG. 22, scanning electron microscope (SEM) images of the scribe line regions 115 of the third embodiment (left) and the fourth embodiment (right) show that, the metallic layer 162 of the fourth embodiment is formed on the scribe line region 115.

Referring back to FIG. 23, in step S500, the second metallic layer 132 is formed on the first dielectric layer 131, the metallic layer 162, and the second metallic layer 132. That is, in the scribe line region 115, the first dielectric layer 131, the metallic layer 162, and the second metallic layer 132 are stacked on the epitaxial layered structure 110 in such order.

In step S600, the electrically conductive connecting layer 270 may further include a metallic bonding material for improving a bonding strength between the substrate 180 and the electrically conductive connecting layer 270. By forming the metallic layer 162 in the scribe line region 115, avoid content of the metallic bonding material in the electrically conductive connecting layer 270 may be decreased. Referring again to FIG. 24, in step S700, the metallic layer 162 in the scribe line region 115 may absorb heat energy generated from laser scribing, thereby preventing the formation of explosive points caused by heat accumulation in the first and second dielectric layers 131, 132.

Figure 26:
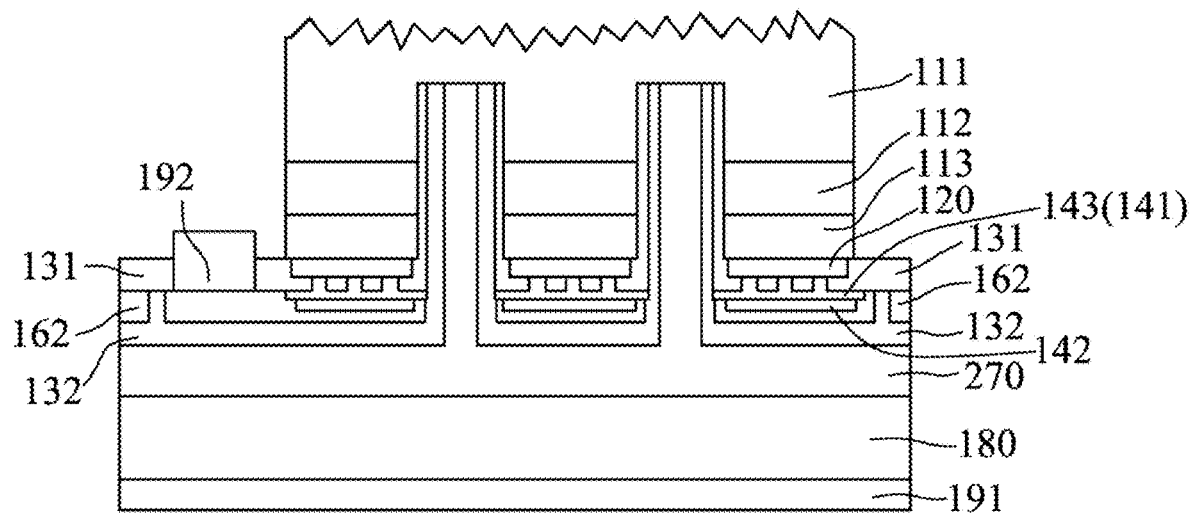
FIG. 26 is a schematic view illustrating a fifth embodiment of the LED according to the disclosure.

Referring to FIG. 26, a fifth embodiment of the LED according to the disclosure is similar to the third embodiment except that, in the fifth embodiment, the LED emits light having an emission wavelength of at least 450 nm, and the first electrically conductive layer 141 is made of ITO (i.e., an ITO layer 143), so as to increase an adhesion between the second electrically conductive layer 142 and the first dielectric layer 131. The ITO layer 143 may have a thickness of not greater than 10 nm.

Figure 27:
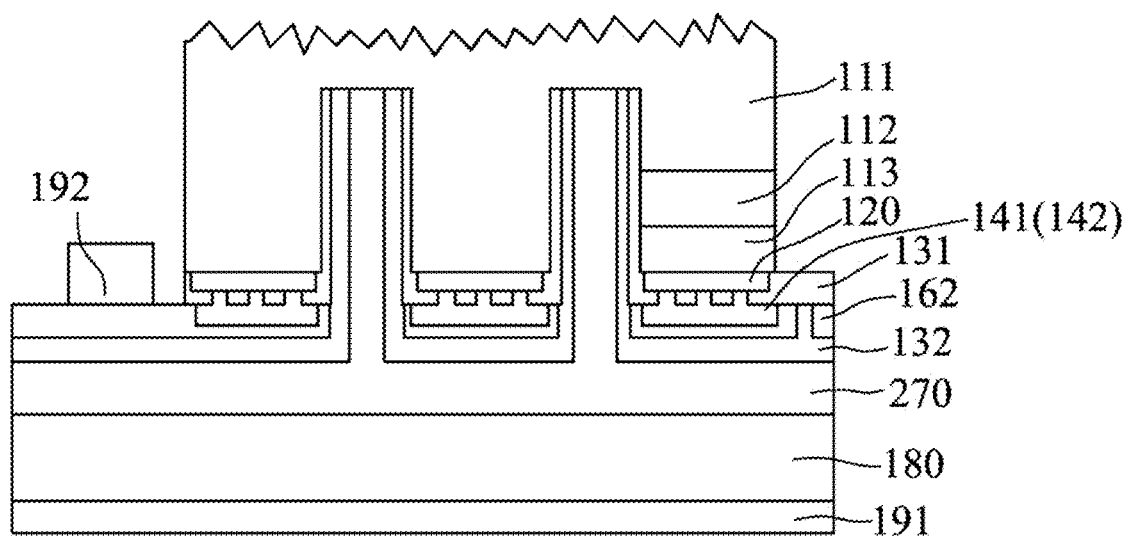
FIG. 27 is a schematic view illustrating a sixth embodiment of the LED according to the disclosure.

Referring to FIG. 27, a sixth embodiment of the LED according to the disclosure is similar to the third embodiment except that, in the sixth embodiment, the LED emits light having an emission wavelength of not greater than 360 nm, and that the first and second electrically conductive layers 141, 142 are both made of Al. That is to say, the conductive mirror structure 140 is formed as a single layer structure (i.e., an Al mirror), and may have a thickness ranging from 1000 Å to 5000 Å.

In sum, by formation of the conductive mirror structure 140 including the first and second electrically conductive layers 141, 142 which have reflectances that satisfy the relationships as disclosed herein, the LED of this disclosure may have an increased light extraction efficiency.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light-emitting diode, comprising:
an epitaxial layered structure including a first semiconductor layer, an active layer disposed on said first semiconductor layer, and a second semiconductor layer disposed on said active layer opposite to said first semiconductor layer;
a conductive mirror structure including a first electrically conductive layer disposed on said second semiconductor layer opposite to said active layer, and a second electrically conductive layer disposed on said first electrically conductive layer opposite to said epitaxial layered structure;
a light-transmissive structure which includes a first dielectric layer disposed between said epitaxial layered structure and said conductive mirror structure, and a second dielectric layer disposed on said first dielectric layer and being made of an electrically insulating material;
a metallic layer which is disposed between and in direct contact with said first and second dielectric layers; and
a metallic protective layer which is disposed between said second electrically conductive layer and said second dielectric layer, and which completely covers said second electrically conductive layer,
wherein said first electrically conductive layer has a first reflectance R1 to light emitted from said epitaxial layered structure, and said second electrically conductive layer has a second reflectance R2 to light emitted from said epitaxial layered structure, the first reflectance R1 being smaller than the second reflectance R2;
wherein said metallic layer is spaced apart from said metallic protective layer by said second dielectric layer so as to permit said metallic layer to be electrically isolated from said metallic protective layer;
wherein said metallic protective layer is in contact with said conductive mirror structure;
wherein said metallic protective layer and said metallic layer, which are made of a same material, are disposed on said second dielectric layer such that upper surfaces of said metallic protective layer and said metallic layer are flush with each other and are flush with a surface of said second dielectric layer;

wherein said metallic layer is disposed outside a projection of said epitaxial layered structure on said first dielectric layer; and wherein each of said first dielectric layer and said second dielectric layer extends beyond an edge of said epitaxial layered structure.

2. The light-emitting diode according to claim 1, wherein a combination of said first and second electrically conductive layers has a third reflectance R3 to light emitted from said epitaxial layered structure, and (R2−R3)/R2<4%.

3. The light-emitting diode according to claim 1, wherein an emission wavelength of light emitted from said epitaxial layered structure is within a range of 360 nm to 450 nm.

4. The light-emitting diode according to claim 2, wherein an emission wavelength of light emitted from said epitaxial layered structure is within a range of 385 nm to 450 nm, and the third reflectance R3 is not lower than 90%.

5. The light-emitting diode according to claim 2, wherein an emission wavelength of light emitted from said epitaxial layered structure is within a range of 365 nm to 450 nm, and the third reflectance R3 is not lower than 85%.

6. The light-emitting diode according to claim 1, wherein said first dielectric layer is made of an electrically insulating material.

7. The light-emitting diode according to claim 1, wherein said first dielectric layer has a thickness of not greater than 5000 Å.

8. The light-emitting diode according to claim 1, wherein each of said first and second electrically conductive layers is made of a metallic material.

9. The light-emitting diode according to claim 8, wherein said first electrically conductive layer is made of one of aluminum and rhodium, and said second electrically conductive layer is made of silver.

10. The light-emitting diode according to claim 1, wherein said first electrically conductive layer has a thickness of not greater than 50 Å.

11. The light-emitting diode according to claim 1, wherein said second electrically conductive layer has a thickness within a range of 100 Å to 5000 Å.

12. The light-emitting diode according to claim 1, further comprising an electrically conductive connecting layer disposed on said second electrically conductive layer opposite to said first electrically conductive layer, said epitaxial layered structure being formed with at least one indentation which extends through said active layer and said second semiconductor layer and which terminates at said first semiconductor layer to expose said at least one first semiconductor layer, said light-transmissive structure covering a side wall of said indentation, and said electrically conductive connecting layer filling said at least one indentation to be electrically connected with said first semiconductor layer.

13. The light-emitting diode according to claim 1, wherein said second electrically conductive layer is disposed between said first and second dielectric layers.

* * * * *